(12) United States Patent
Mohanavelu (10) Patent No.: US 7,474,127 B2
(45) Date of Patent: Jan. 6, 2009

(54) SIGNAL CONVERTER

(75) Inventor: Ravindran Mohanavelu, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 11/326,624

(22) Filed: Jan. 6, 2006

(65) Prior Publication Data

US 2007/0171117 A1 Jul. 26, 2007

(51) Int. Cl.
*H03K 19/086* (2006.01)
(52) U.S. Cl. .......................... 326/127; 326/115; 326/63
(58) Field of Classification Search .................. 326/66, 326/64, 124, 127, 63, 68
See application file for complete search history.

(56) References Cited

U.S. PATENT DOCUMENTS

| | | | | |
|---|---|---|---|---|
| 4,871,933 A | * | 10/1989 | Galbraith | 327/53 |
| 5,502,405 A | * | 3/1996 | Williams | 326/66 |
| 5,850,155 A | * | 12/1998 | Matsumoto | 326/109 |
| 6,040,710 A | * | 3/2000 | Nakauchi | 326/66 |
| 6,211,699 B1 | * | 4/2001 | Sudjian | 326/66 |
| 6,696,858 B2 | * | 2/2004 | Tokai | 326/68 |
| 6,809,562 B2 | * | 10/2004 | Wada et al. | 327/113 |
| 7,187,207 B2 | * | 3/2007 | Rowley | 326/83 |

* cited by examiner

*Primary Examiner*—Vibol Tan
(74) *Attorney, Agent, or Firm*—Blakely, Sokoloff, Taylor & Zafman LLP (57) ABSTRACT

According to one embodiment of the invention, a method for receiving a first signal in a first plurality of switching elements from a second plurality of switching elements, receiving a second signal in second plurality of switching elements from first plurality of switching elements, alternatively converting a first logic signal by first plurality of switching elements based on received first signal, and a second logic signal by the second plurality of switching elements based on received second signal. According to another embodiment of the invention, a system comprising a first plurality of switching elements to convert a first logic signal based on a predetermined input from a second plurality of switching elements, second plurality of switching elements to convert a second logic signal based on a predetermined input received from first plurality of switching elements; first and second plurality of switching elements to alternatively convert first and second logic signals.

20 Claims, 6 Drawing Sheets

SIGNAL CONVERTER

FIELD

Embodiments of the invention relate to signal processing, and more particularly to a system and method for converting signals.

BACKGROUND

Integrated circuits are in widespread use in computing devices, such as personal computers and workstations. Integrated circuits allow for a large number of transistors in various configurations to be placed in close proximity of each other to effectuate faster computing performance. A prevalent form of transistor configuration implemented in the integrated circuits are the complementary metal-oxide-semiconductor (CMOS) logic circuits, used in microprocessors, micro-controllers, random access memories and other digital logic circuits. CMOS logic circuits offer advantages over other form of logic circuits by consuming less power, dissipating less heat, as well as allowing for larger density of logic to be placed on an integrated circuit.

The use of CMOS logic, however, is also not without limitations. CMOS logic circuits are not the fastest in a given process and another logic scheme known as current mode logic is used in high speed paths. Also the CMOS logic circuits require rail-to-rail (voltage source to ground) input voltage signals to operate. By virtue of design CML circuits cannot provide rail-to-rail output signals. A current mode logic (CML) signal is normally required to be converted to a rail to rail before being provided to the CMOS logic domain. As such, a CML-to-CMOS converter is used to convert CML signals to CMOS logic domain signals.

Currently, the CML-to-CMOS converters use a two stage amplification circuit: the first stage is a differential amplifier with a current mirror load, outputting to the second stage, of a CMOS inverter, which provides additional amplification to make the CML signal swing rail to rail. This two-stage amplification design, however, is not without shortcomings, especially when applied to high speed clocking circuits.

In the first stage, for example, the use of current mirror load limits the bandwidth of the circuit because to increase amplification gain, larger resistances must be used which in turn reduces the circuit bandwidth. In the second stage, for example, poor supply noise rejection exists, leading to often unacceptable levels of supply noise induced jitter in the high speed circuit. In addition, the overall two stage amplification design suffers from relatively high latencies.

BRIEF DESCRIPTION OF THE DRAWINGS

Embodiments of the invention may best be understood by referring to the following description and accompanying drawings that are used to illustrate embodiments of the invention.

DETAILED DESCRIPTION

Embodiments of the invention generally relate to a system, apparatus and method for converting signal, such as logic signal. Herein, an exemplary embodiment of the invention may be applicable to high speed clocking circuits used in a variety of computing devices, which are generally considered stationary or portable electronic devices. Examples of a computing device may include, but are not limited or restricted to a computer, a set-top box, video game systems, music playback systems, and the like.

Reference in the specification to the term "one embodiment of the invention" or "an embodiment of the invention" means that a particular feature, structure, or characteristic described in connection with the embodiment of the invention is included in at least one embodiment of the invention. The appearances of the phrase "in one embodiment of the invention" in various places in the specification are not necessarily all referring to the same embodiment of the invention.

In the following description, numerous details are set forth. It will be apparent, however, to one skilled in the art, that the embodiments of the invention may be practiced without these specific details. In other instances, well-known structures and devices are shown in block diagram form, rather than in detail, in order to avoid obscuring the embodiments of the invention.

Also in the following description are certain terminologies used to describe features of the various embodiments of the invention. For example, the term "CMOS logic domain" refers to a circuit or circuits that utilize complementary metal oxide semiconductor transistors operating with rail-to-rail (voltage source to ground) signals. The term "CML logic" refers to a circuit or circuits that operate with swing voltages that are less than rail-to-rail. A "CML-to-CMOS converter" refers to a circuit or circuits that convert a signal from a swing voltage signal to a rail-to-rail voltage signal.

Figure 1:
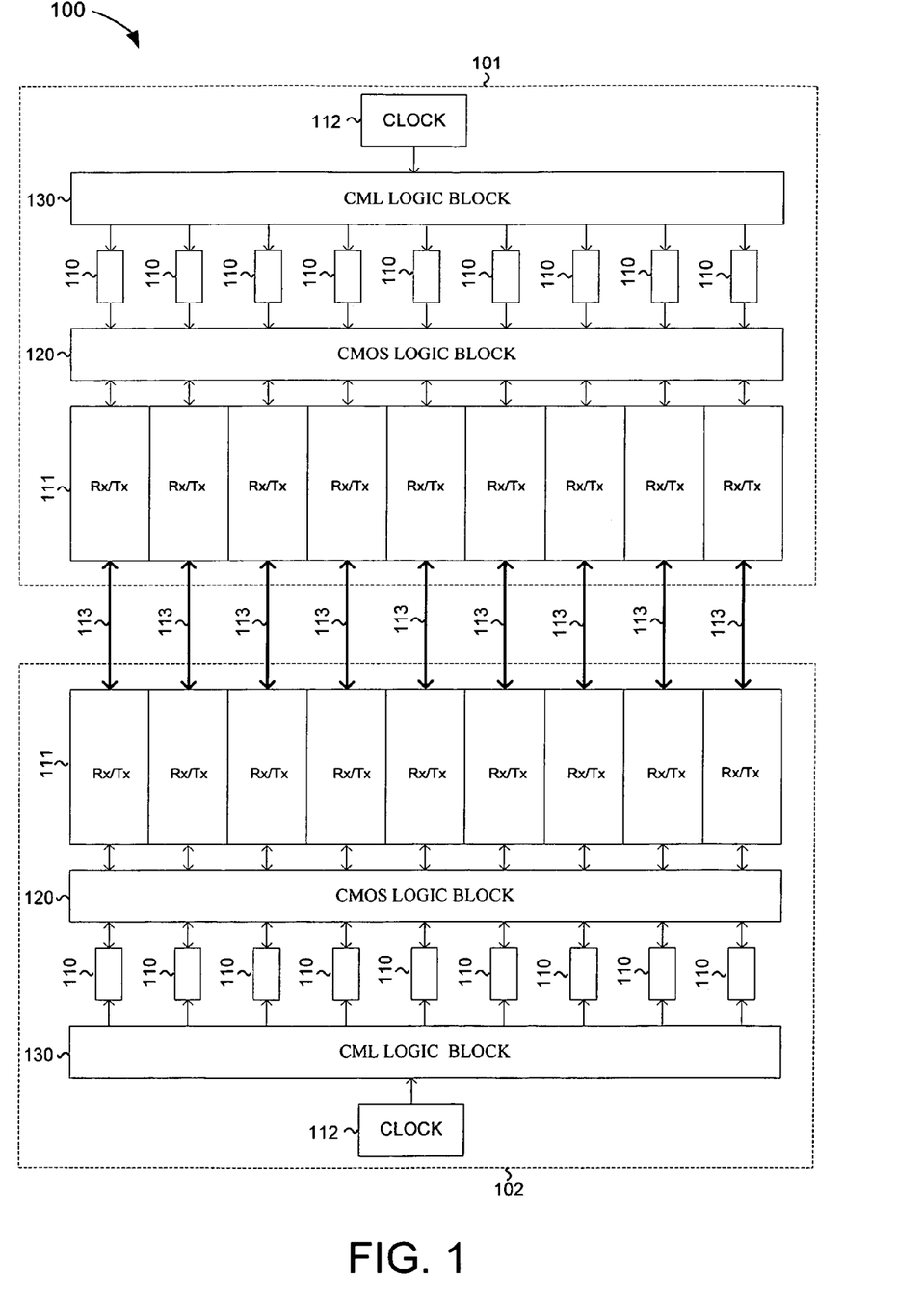
FIG. 1 is a block diagram of a system in which embodiments of the invention may be practiced.

With reference to FIG. 1, an exemplary signal conversion environment 100 is shown in which exemplary embodiments of the invention may be practiced. As shown in FIG. 1, the signal conversion environment 100 includes an integrated circuit 101 in communication with an integrated circuit 102, such as via wireline channels 113. In an exemplary embodiment of the invention, one of the integrated circuits 101 or 102 is transmitter and the other is a receiver. Suitably, one of the integrated circuits 101 or 102 is a dynamic random access memory (DRAM) and the other is a controller, such as memory controller. In an exemplary embodiment of the invention, the signal conversion environment 100 is an input/output (I/O) environment, such as a high speed Memory I/O interface, and associated circuits which will enable high speed communication between the integrated circuits 101 and 102, such as between a DRAM memory chip and a chipsets, microprocessor, controller etc.

As shown in FIG. 1, each of the integrated circuits 101 and 102 includes a current mode logic (CML) block 130 which communicates with a complementary metal oxide semiconductor (CMOS) logic block 120 via a signal converter 110, as described below and in greater detail in conjunction with FIG. 2. In an exemplary embodiment of the invention the transmitter integrated circuit, such as integrated circuit 101, uses the clock 112 to send data over the wireline channels 113 which is then received by the receiver integrated circuit, such as integrated circuit 102, which also uses a clock 112 to retrieve the data. Since the quality of the clock 112 is often critical to the operation of the signal conversion environment 100, high speed long distance routings of the clock 112 is done using CML logic block 130 which is then converted via the signal converters 110 to CMOS logic block 120 placed close to the receiver/transmitter (Rx/Tx) blocks 111. In this way, the global clocking for long distances, such as for distances 500 micro-meter, will be done in CML logic block 130 and the local clocking near the RX/TX blocks 111 will be performed in CMOS logic block 120.

Figure 2:
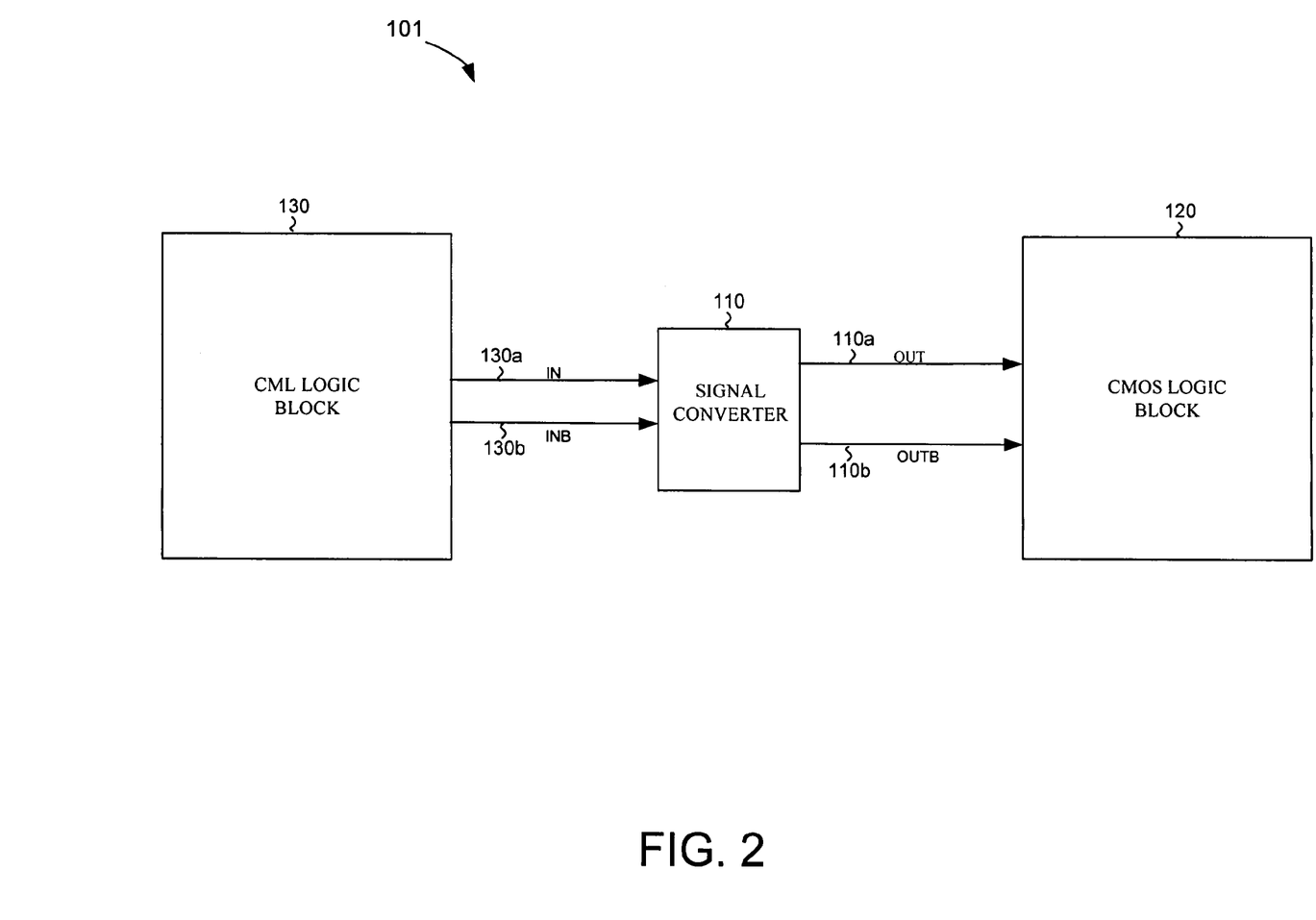
FIG. 2 further illustrates the block diagram of the system shown in FIG. 1.

FIG. 2 further illustrates the block diagram of the system shown in FIG. 1. As shown in FIG. 2, an integrated circuit of exemplary signal conversion environment 100, such as an integrated circuits 101 or 102, includes one or more signal converter 110s, each of which receives as input a set of CML signals 130a and 130b, such as complementary CML logic signals IN and INB, received alternatively from a CML domain block 130, such as a high power, high speed (e.g., more than 1 gigabit per second), low complexity CML logic block. The signal converter 110 then alternatively converts CML logic signals 130a and 130b into complementary metal oxide semiconductor (CMOS) logic signals 110a and 110b, respectively, such as complementary output signals OUT and OUTB, as described in greater detail in conjunction with FIGS. 3-7 below. CMOS logic signals 110a and 110b are then provided to the CMOS logic domain block 120, such as a low power, low speed (e.g., less than 1 gigabit per second), high complexity CMOS subsystem.

Figure 3:
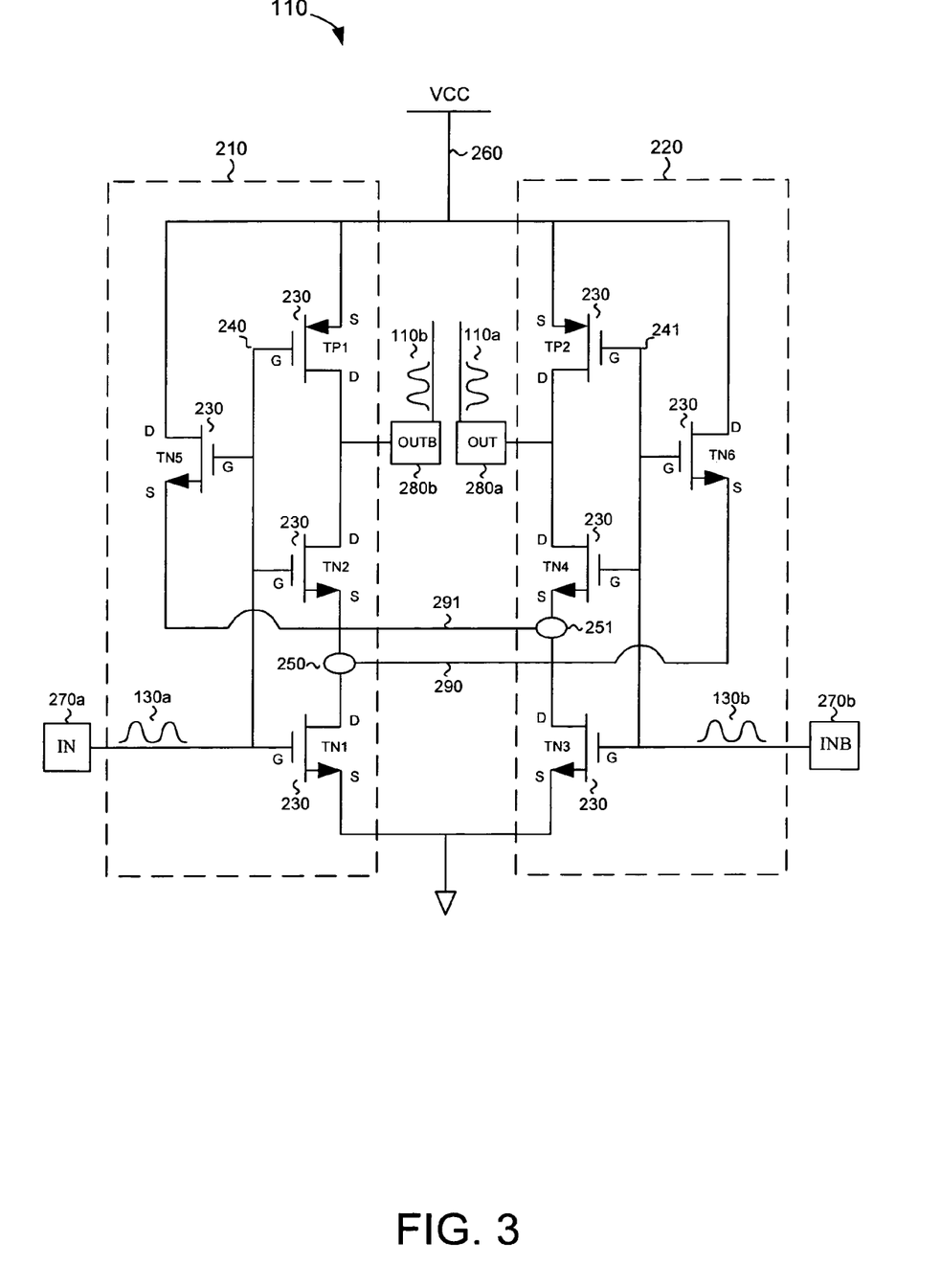
FIG. 3 is a circuit diagram of an exemplary embodiment of the invention.

FIG. 3 is a circuit diagram of an exemplary embodiment of the signal converter 110 of FIG. 3. As shown in FIG. 3, the signal converter 110 comprises a plurality of switching elements 230, such as the transistors TP1, TP2, and TN1 through TN6. In an exemplary embodiment of the invention, TP1 and TP2 are p-type Metal Oxide Silicon (PMOS) transistors, and TN1 through TN6 are n-type Metal Oxide Silicon (NMOS) transistors, each having a gate (G), a source (S) and a drain (D), as shown in FIG. 2. Of course, it is contemplated that the types of transistors used may be altered to produce different embodiments of the invention.

In an exemplary embodiment of the invention, the switching elements 230 are grouped into two sub-circuit groups 210 and 220 represented by dashed lines, with the sub-circuit group 210 comprising the transistors TP1, TN1, TN2 and TN5, and sub-circuit group 220 comprising the transistors TP2, TN4, TN3 and TN6. As shown in FIG. 2, in the sub-circuit group 210, the transistors TP1, TN5 and TN2 and TN1 share a common gate 240 coupled to the input 270a of the signal converter 110 for receiving of the CML logic signal 130a. The source of the transistor TP1 and the drain of the transistor TN5 are coupled to a voltage source (Vcc) 260, such as a 1.25 volts source for example. The drain of the transistor TP1 is coupled to the drain of the transistor TN2, as well as to the output 280b of signal converter 110 for outputting of CMOS logic signal 110b. A source of the transistor TN2 is coupled to a drain of the transistor TN1, as well as to an input 250 of the sub-circuit group 210. The source of the transistor TN5 is coupled to an input 251 of the sub-circuit group 220 to provide the sub-circuit group 220 with a predetermined input as described below and in greater detail in conjunction with FIG. 4.

As also shown in FIG. 3, in the sub-circuit group 220, the transistors TP2, TN6, TN4 and TN3 share a common gate 241 connected to the input 270b of the signal converter 110 for receiving of the CML logic signal 130b. The source of the transistor TP2 and the drain of the transistor TN6 are coupled to the voltage source 260. The drain of the transistor TP2 is coupled to the drain of the transistor TN4, as well as to the output 280a of signal converter 110 for outputting of CMOS logic signal 110a. A source of the transistor TN4 is coupled to a drain of the transistor TN3, as well as to the input 251 of the sub-circuit group 220. The source of the transistor TN6 is coupled to the input 250 of the sub-circuit group 210 to provide the sub-circuit group 210 with a predetermined input as described below and in greater detail in conjunction with FIG. 4.

Figure 4:
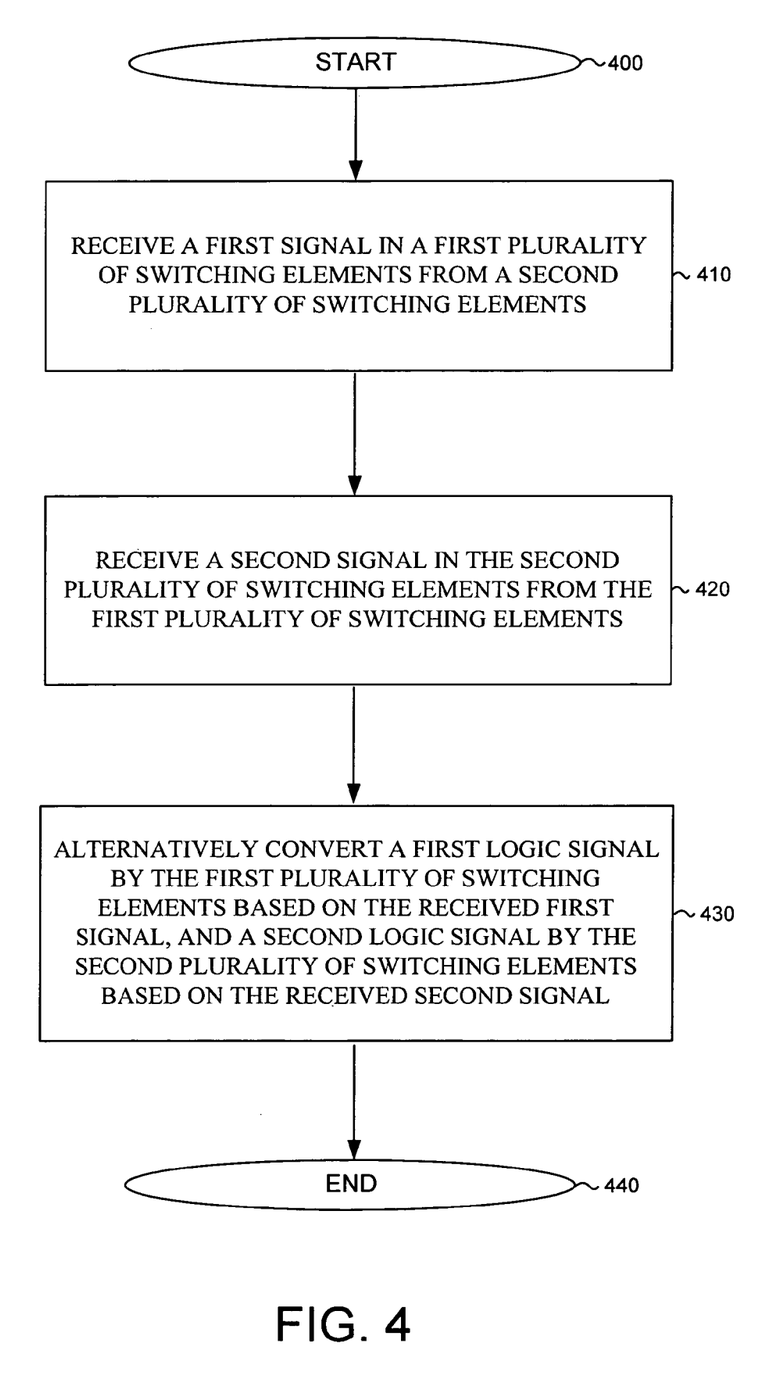
FIGS. 4-7 are flowcharts illustrating exemplary processes according to an exemplary embodiment of the invention.

FIG. 4 is a flow chart, which in conjunction with FIG. 3, illustrates an exemplary process of the overall operations of the signal converter 110. As shown in FIG. 4, following the start (block 400) signals 290, and 291 are received in sub-circuit group 210, and sub-circuit group 220, respectively (blocks 410, 420). Signal 290 is received in a first plurality of switching elements 230, such as in input 250 of the sub-circuit group 210, from a second plurality of switching elements 230, such as from the sub-circuit group 210 (block 410). In an exemplary embodiment, signal 290 is a predetermined input voltage applied to the input 250. A signal 291, such as a second predetermined applied input voltage, is received in the input 251 of the sub-circuit group 220, from the sub-circuit group 210 (block 420). In an exemplary embodiment, signal 291 is a predetermined input voltage applied to the input 251. The signal converter 110 alternatively converts CML logic signals 130a, and 130b, received from inputs 270a and 270b, respectively, into CMOS logic signals 110b and 110a, respectively, that are outputted from outputs 280b and 280a, respectively (block 430). The CML logic signals 130a is converted by the sub-circuit group 210 based on the received predetermined input signal 290 and the CML logic signals 130b is converted by the sub-circuit group 220 based on the received predetermined input signal 291, as described in greater detail in conjunction with FIGS. 5-7 below. Following the conversion operations (block 430), the overall process ends (block 440).

Figure 5:
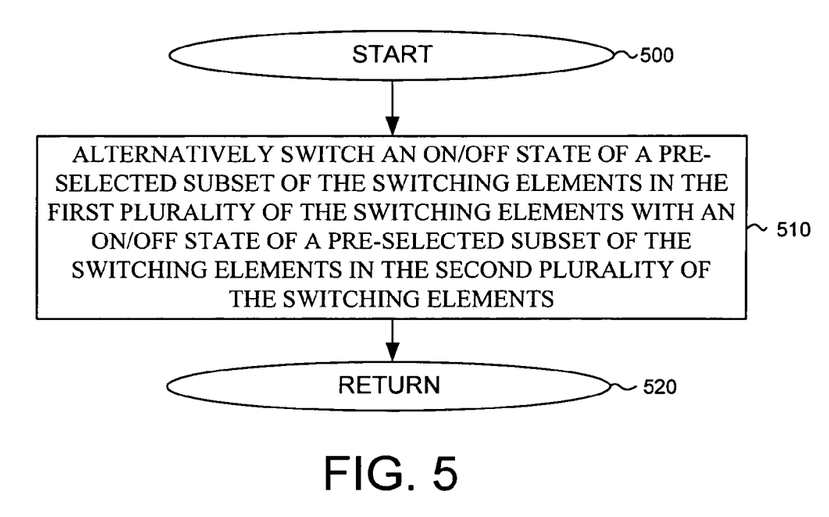

FIG. 5 is a flow chart further illustrating the exemplary signal conversion process of FIG. 4 (block 430). As shown in FIG. 5, following start (block 500), an ON/OFF state of a pre-selected subset of the switching elements 230 in the sub-circuit group 210, such as the transistors TP1 and TN2, is alternatively switched with an ON/OFF state of a pre-selected subset of the switching elements 230 in the sub-circuit group 220, such as the transistors TP2 and TN4, so that for example when the transistors TP1 and TN4 are ON, the transistors TP2 and TN2 are OFF, and vice versa. This alternative switching will result in the CML logic signals 130a, and 130b to be alternatively converted into CMOS logic signals 110b and 110a, respectively, as described in greater detail in conjunction with FIGS. 6-7 below. Following the conversion operations (block 510), the process is retuned (block 520) to FIG. 4 (block 430).

Figure 6:
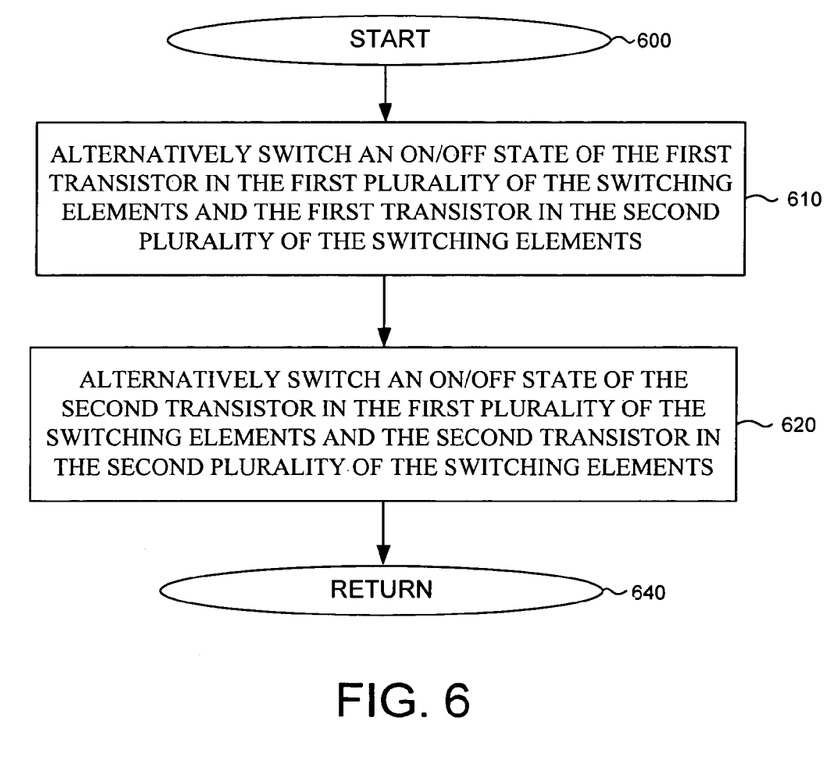

FIG. 6 is a flow chart further illustrating the exemplary signal conversion process of FIG. 5 (block 510). As shown in FIG. 6, following start (block 600), an ON/OFF state of the transistor TP1 in the sub-circuit group 210 is alternatively switched with that of the transistor TP2 in the sub-circuit group 220 so that for example when the transistor TP1 is ON, the transistor TP2 is OFF, and vice versa (block 610). Next, an ON/OFF state of the transistor TN2 in the sub-circuit group 210 is alternatively switched with that of the transistor TN4 in the sub-circuit group 220 so that for example when the transistor TN2 is ON, the transistor TN4 is OFF, and vice versa (block 620). Suitably, the transistors TP1 and TN4 are both ON at the same time, and the transistors TP2 and TN2 are both OFF at the same time, and vice versa. Following the switching operations (blocks 610, 620), the process is returned (block 640) to FIG. 5 (block 510).

Figure 7:
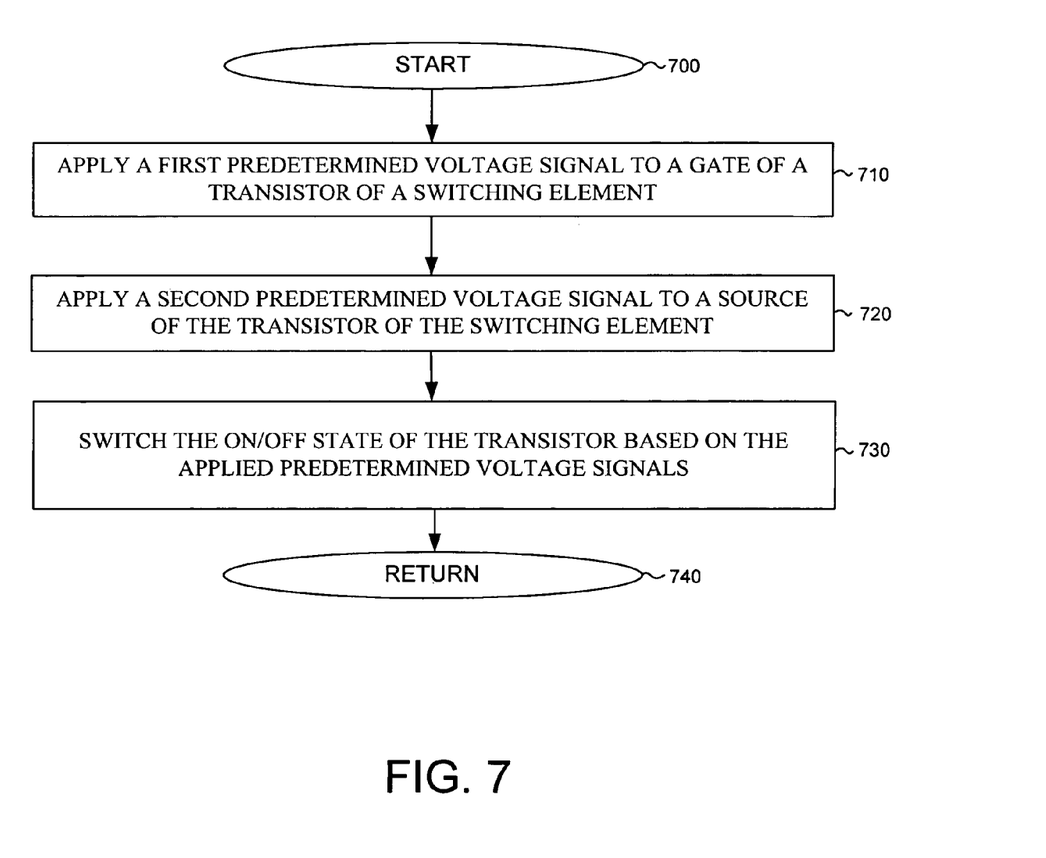

FIG. 7 is a flow chart further illustrating the alternative switching processes of FIG. 6 (blocks 610, 620). As shown in FIG. 7, following start (block 700), the switching the ON/OFF state of each transistor is achieved by applying predetermined voltage signals to a gate and a source of a transistor of a switching element 230 (blocks 710, 720), which will cause the transistor to switch from an ON state to an OFF state and vice versa (block 730). Following the switching operations (block 730), the process is returned (block 740) to FIG. 6 (blocks 610, 620).

As an example of the foregoing operations of FIGS. 5-7, CML logic signals 130a and 130b are received in inputs 270a and 270b, respectively. Each of the CML logic signals 130a and 130b have a voltage which may range from a source voltage (Vcc) of the voltage source 260 to a predetermined swing voltage (Vs) of Vcc-Vs. The voltage of the CML logic signals 130a and 130b are complementary, so that for example when the voltage of the CML logic signal 130a is at its peak of Vcc, the voltage of the CML logic signal 130b is at its lowest of Vcc-Vs. Alternatively when the voltage of the CML logic signal 130b is at its peak of Vcc, the voltage of the CML logic signal 130a is at its lowest of Vcc-Vs.

In the sub-circuit group 210, when a Vcc voltage of CML logic signal 130a is applied to the gate of the transistor TP1, it results in the transistor TP1 to turn OFF with a gate-to-source voltage (Vgs) of zero. In the sub-circuit group 220, when a Vcc-Vs voltage of CML logic signal 130b is applied to the gate of the transistor TP2, it results in the transistor TP2 to turn ON with a Vgs of −Vs (e.g., Vcc-Vs-Vcc). Conversely, applying a CML logic signal 130a with a voltage of Vcc-Vs and a CML logic signal 130b with a voltage of Vcc results in the transistor TP1 to turn ON and the transistor TP2 to turn OFF. The transistors TP1 and TP2 are thus alternatively switched to ON/OFF states based on the alternating voltages of the CML logic signals 130a and 130b. In the sub-circuit group 210, when a Vcc voltage of CML logic signal 130a is applied to the gate of the transistors TP1 it results in the transistor TN5 to have a Vgs of Vth(TN5) where Vth(TN5) is the threshold voltage of the transistor TN5. In the sub-circuit group 220, when a Vcc-Vs voltage of CML logic signal 130b is applied to the gate of the transistors TN6 it results in the transistor to have a Vgs of Vth(TN6) where Vth(TN6) is the threshold voltage of the transistor TN6.

The Vsource of the transistor TN5 (e.g., Vcc-Vth(TN5)) is also applied to the input 251 of the sub-circuit group 220 (FIG. 3) and hence to the source of the transistor TN4 which will switch the transistor TN4 to OFF since the voltage at the gate of the transistor TN4 is the voltage of the CML logic signal 130b at its lowest of Vcc-Vs. Likewise, the Vsource of the transistor TN6 (e.g., Vcc-Vs-Vth(TN6)) is also applied to the input 250 of the sub-circuit group 210 (FIG. 3) and hence to the source of the transistor TN2 which will switch the transistor TN2 to ON since the voltage at the gate of the transistor TN2 is the voltage of the CML logic signal 130a at its highest of Vcc. Conversely, applying a CML logic signal 130a with a voltage of Vcc-Vs and a CML logic signal 130b with a voltage of Vcc results in the TN2 to turn OFF and the TN4 to turn ON. The transistors TN2 and TN4 are thus alternatively switched to ON/OFF states based on the alternating voltages of the CML logic signals 130a and 130b.

The transistor TN1, and TN3, will always be set to ON. They have a Vgs of Vcc and Vcc-Vs, respectively, when applying a CML logic signal 130a with a voltage of Vcc and a CML logic signal 130b of Vcc-Vs which is sufficient to maintain an ON state of the transistors TN1, and TN3. The transistor TN1, and TN3, will have a Vgs of Vcc-Vs and Vcc, respectively, when applying a CML logic signal 130a with a voltage of Vcc-Vs and a CML logic signal 130b of Vcc, which is sufficient to maintain an ON state of the transistors TN1, and TN3.

Therefore when applying a CML logic signal 130a with a voltage of Vcc and a CML logic signal 130b with a voltage of Vcc-Vs, in sub-circuit group 210 the transistor TP1 is OFF, and the transistors TN2 and TN1 are ON so that the output CMOS logic signal 110b will have a low voltage, such as a ground voltage. In sub-circuit group 220, the transistors TP2 and TN3 are ON, while the transistor TN4 is OFF so the output CMOS logic signal 110a will have a high voltage, such as Vcc. Conversely, applying a CML logic signal 130a with a voltage of Vcc-Vs and a CML logic signal 130b of Vcc results in the output CMOS logic signal 110b to have a high voltage, such as Vcc and the CMOS logic signal 110a to have a low voltage, such as a ground voltage. Thus, CMOS logic signals 110a and 110b are of alternating voltages ranging from a ground voltage to a source voltage, with a voltage of CMOS logic signals 110a complementary to a voltage of CMOS logic signal 110b.

In this way, the CMOS logic signals 110a and 110b are provided to the CMOS logic domain block 120 that are rail-to-rail without performing amplifications on CML logic signals 130a and 130b. In an exemplary embodiment of the invention, the signal converter 110 generates CMOS logic signals 110a and 110b at a latency of approximately 35 picoseconds (ps), with a supply noise jitter of approximately 2 ps with 10% supply noise and consuming 1.2 mA of current.

It should be noted that the various features of the foregoing embodiments of the invention were discussed separately for clarity of description only and they can be incorporated in whole or in part into a single embodiment of the invention having all or some of these features.

What is claimed is:

1. A method comprising:
    receiving a first predetermined input signal in a first plurality of switching elements from a second plurality of switching elements;
    receiving a second predetermined input signal in the second plurality of switching elements from the first plurality of switching elements; and
    alternatively converting a first input logic signal to a first output by the first plurality of switching elements based on the first predetermined input signal received, and a second input logic signal to a second output by the second plurality of switching elements based on the second predetermined input signal received, the second output being complementary to the first output, the first and second outputs being different than the first and second predetermined input signals.

2. The method of claim 1, the alternatively converting further comprising:
    alternatively switching an ON/OFF state of a pre-selected subset of the switching elements in the first plurality of the switching elements with an ON/OFF state of a pre-selected subset of the switching elements in the second plurality of the switching elements.

3. The method of claim 2, wherein each switching element in the first and the second plurality of switching elements comprises a transistor including a gate and a source.

4. The method of claim 3, further comprising:
    applying a first predetermined voltage signal to a gate of a transistor of a switching element;
    applying a second predetermined voltage signal to a source of the transistor of the switching element; and
    switching the ON/OFF state of the transistor based on the applied predetermined voltage signals.

5. The method of claim 2, the pre-selected subset of the switching elements in the first plurality of the switching elements includes a first transistor and a second transistor, and the pre-selected subset of the switching elements in the second plurality of the switching elements includes a first transistor and a second transistor.

6. The method of claim 5, comprising:
alternatively switching an ON/OFF state of the first transistor in the first plurality of the switching elements and the first transistor in the second plurality of the switching elements; and
alternatively switching an ON/OFF state of the second transistor in the first plurality of the switching elements and the second transistor in the second plurality of the switching elements.

7. The method of claim 1, wherein the first logic signal and the second logic signal are each a voltage signal alternatively ranging from a predetermined swing voltage to a voltage of a voltage source connected to each of the first and second plurality of the switching elements.

8. A system comprising:
a first integrated circuit in communication with a second integrated circuit, and at least one of the first and second integrated circuits comprising:
a first plurality of switching elements to convert a first input logic signal based on a first predetermined input received from a second plurality of switching elements, the second plurality of switching elements to convert a second input logic signal based on a second predetermined input received from the first plurality of switching elements, and
the first and the second plurality of switching elements to alternatively convert the first input logic signal to a first output and the second input logic signal to a second output complementary to the first output, the first and second outputs being different than the first and second predetermined input signals.

9. The system of claim 8, wherein the first integrated circuit is a dynamic random access memory (DRAM) and the second integrated circuit is a controller.

10. The system of claim 8, wherein each switching element in the first plurality of switching elements and the second plurality of switching elements comprises a transistor including a gate, a source and a drain.

11. The system of claim 10, wherein the first plurality of switching elements comprises:
a first transistor, a second transistor, a third transistor and a fourth transistor, each connected at a gate to the an input of the first plurality of switching elements to receive the first logic signal;
the first transistor connected at a source to a voltage source, connected at a drain to a drain of the second transistor and to a first output of the first plurality of switching elements;
the second transistor connected at the source to a drain of the fourth transistor and to an output of the second plurality of switching elements; and
the third transistor connected at a drain to the voltage source, connected at a source to an input of the second plurality of switching elements to provide the predetermined input received in the second plurality of switching elements from the first plurality of switching elements.

12. The system of claim 11, wherein the first transistor is a P-type Metal Oxide Silicon (PMOS) transistor, and the second transistor, third transistor and fourth transistors are each a N-type Metal Oxide Silicon (NMOS) transistor.

13. The system of claim 10, wherein the second plurality of switching elements comprises:
a first transistor, a second transistor, a third transistor and a fourth transistor, each connected at a gate to the an input of the second plurality of switching elements to receive the second logic signal;
the first transistor connected at a source to a voltage source, connected at a drain to a drain of the second transistor and to a first output of the second plurality of switching elements;
the second transistor connected at the source to a drain of the fourth transistor and to an output of the first plurality of switching elements; and
the third transistor connected at a drain to the voltage source, connected at a source to an input of the first plurality of switching elements to provide the predetermined input received in the first plurality of switching elements from the second plurality of switching elements.

14. The system of claim 13, wherein the first transistor is a P-type Metal Oxide Silicon (PMOS) transistor, and the second transistor, third transistor and fourth transistors are each a N-type Metal Oxide Silicon (NMOS) transistor.

15. The system of claim 8, wherein the first logic signal and the second logic signals are current mode logic (CML) signals and wherein the system alternatively converts the first logic signal to a first complementary metal oxide semiconductor (CMOS) logic signal, and the second logic signal to a second CMOS logic signal.

16. An apparatus comprising:
a complementary metal oxide semiconductor (CMOS) logic subsystem; and
a signal converter subsystem to alternatively provide a first CMOS logic signal and a second CMOS logic signal to the CMOS logic subsystem, the signal converter subsystem including a first plurality of switching elements to generate the first CMOS logic signal at a first output based on a first predetermined input from a second plurality of switching elements, the second plurality of switching elements to generate the second CMOS logic signal at a second output based on a second predetermined input received from the first plurality of switching elements, the second output being complementary to the first output, the first and second outputs being different than the first and second predetermined input signals.

17. The apparatus of claim 16, wherein the first plurality of switching elements generates the first CMOS logic signal based on a received first logic signal.

18. The apparatus of claim 17, wherein the second plurality of switching elements generates the second CMOS logic signal based on a received second logic signal.

19. The apparatus of claim 18, wherein the received first logic signal and the second logic signals are current mode logic (CML) signals.

20. The apparatus of claim 16, wherein the first CMOS logic signal and the second CMOS logic signal are of a voltage ranging from a ground voltage to a source voltage wherein a voltage of the first CMOS logic signal is complementary to a voltage of the second CMOS logic signal.

* * * * *